United States Patent
Roddy et al.

[11] Patent Number: 6,049,073
[45] Date of Patent: Apr. 11, 2000

[54] CONTROL CIRCUIT FOR A STABILIZED LASER

[75] Inventors: James E. Roddy, Rochester; William R. Markis, Spencerport, both of N.Y.

[73] Assignee: Eastman Kodak Company, Rochester, N.Y.

[21] Appl. No.: 09/049,300

[22] Filed: Mar. 27, 1998

[51] Int. Cl.[7] .................................................. H01S 3/10
[52] U.S. Cl. ............................................. 250/205; 372/31
[58] Field of Search .................................... 250/205, 216; 372/26, 29, 31, 32, 38, 22, 18; 369/116

[56] References Cited

U.S. PATENT DOCUMENTS

| | | | |
|---|---|---|---|
| 4,699,446 | 10/1987 | Banton et al. | 372/18 |
| 4,989,198 | 1/1991 | Kojima et al. | 369/116 |
| 5,019,769 | 5/1991 | Levinson | 372/31 |
| 5,067,117 | 11/1991 | Shimizu et al. | 369/116 |
| 5,175,722 | 12/1992 | Minami et al. | 369/116 |
| 5,197,059 | 3/1993 | Minami et al. | 369/116 |
| 5,363,363 | 11/1994 | Gage | 369/116 |
| 5,386,409 | 1/1995 | Yokota et al. | 369/116 |
| 5,422,900 | 6/1995 | Reele et al. | 372/29 |
| 5,488,621 | 1/1996 | Slawson et al. | 372/31 |
| 5,495,464 | 2/1996 | Fujikawa et al. | 369/116 |
| 5,682,398 | 10/1997 | Gupta | 372/22 |

OTHER PUBLICATIONS

"Effects of high frequency injection and optical feedback on semiconductor laser performance," by Edward C. Gage and Scott Beckens, SPIE, vol. 1316, *Optical Data Storage* (1990), pp. 199–204.

"Control of optical–feedback–induced laser intensity noise in optical data recording," by George R. Gray et al., *Optical Engineering*, Apr. 1993, vol. 32, No. 4, pp. 739–745.

*Primary Examiner*—Stephone B. Allen
*Attorney, Agent, or Firm*—Nelson Adrian Blish

[57] ABSTRACT

A stabilized laser is comprised of a laser for generating radiation responsive to a control signal. A control circuit connected to the laser provides the control signal and an injection circuit injects a radio frequency into the control circuit and the control signal. A back facet photodiode sensor detects radiation emitted from a back faceted laser diode and provides a feedback signal to the control circuit for adjusting laser output power.

3 Claims, 9 Drawing Sheets

CONTROL CIRCUIT FOR A STABILIZED LASER

CROSS REFERENCE TO RELATED APPLICATIONS

U.S. Pat. No. 5,422,900, issued Jun. 5, 1995, entitled INTEGRATED LASER MODULE, by Samuel Reele and Alan L. Korus.

FIELD OF THE INVENTION

This invention relates in general to an image processing apparatus and in particular, to a radio frequency stabilized semi-conductor laser with a back facet closed loop control circuit.

BACKGROUND OF THE INVENTION

In one type of laser printing system, a photosensitive media is placed on a drum and is written to by a laser diode. A light beam from the laser is typically deflected from a polygon or galvanometer, and focused through an imaging lens. As the image is written pixel by pixel, small areas of a photosensitive material are exposed.

The amount of laser energy delivered is important and variations in power level can introduce artifacts in the image printed on the media. For example, using three colored lasers to write to film, variations in power of one of the lasers can introduce an artifact called "banding." In some applications, laser optical power must be controlled to better than 0.5% accuracy in order to obtain a reasonable image quality.

Figure 1:
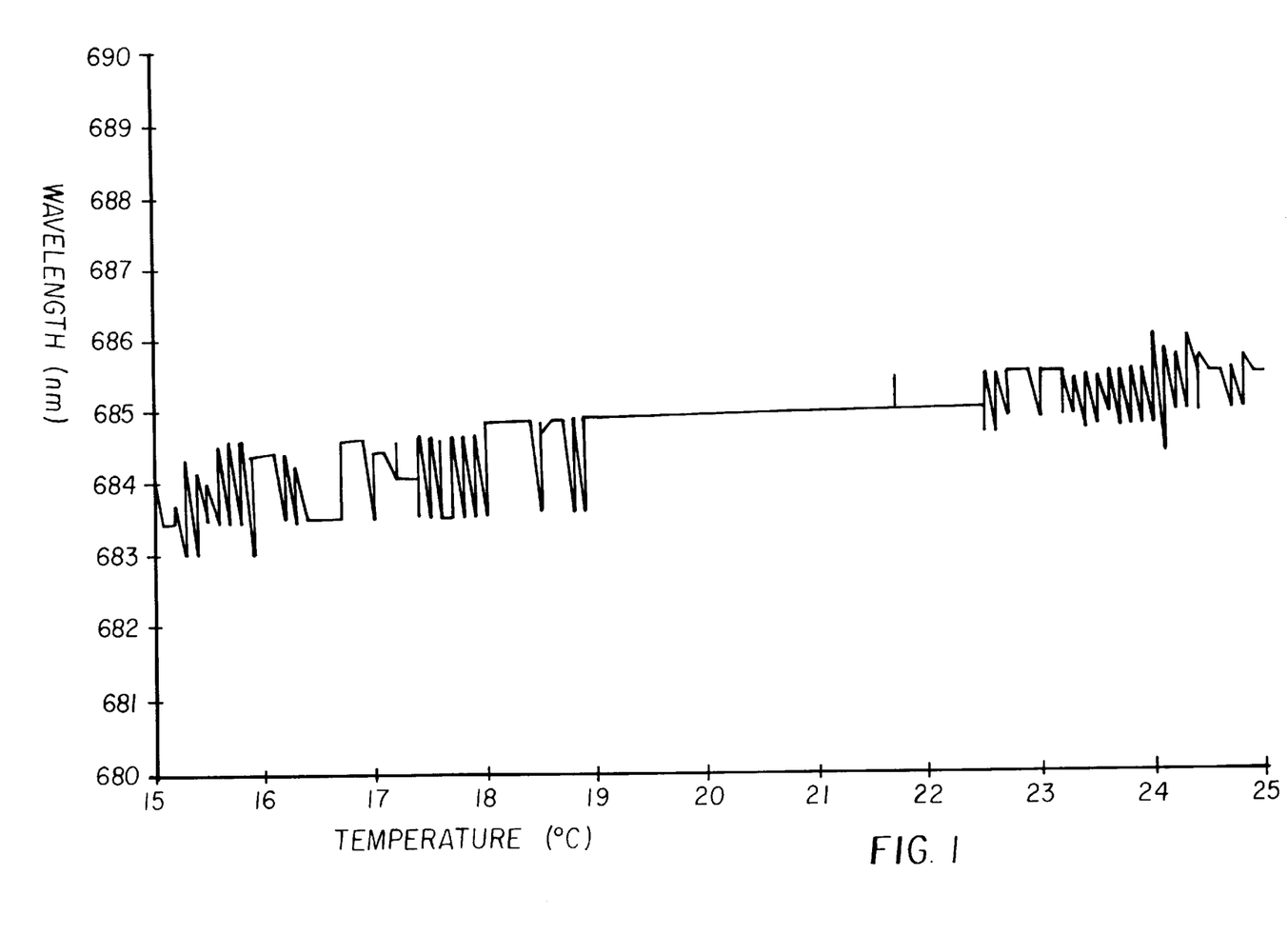
FIG. 1 shows a graph of wavelength versus temperature for an unstabilized laser.

Optical power is affected by many parameters, such as laser diode driving current and operating temperature. In order to ensure that a laser operates at a stable condition, an operating temperature is chosen in which the laser operates at a wavelength which is relatively constant despite minor temperature variations. For example, FIG. 1 shows that a laser operating in the temperature range of 19°–22° C. at a wavelength of approximately 685 nm would be relatively stable. Outside this range there would be variations in intensity of the laser output power and variations in the polarization of the laser output power indicated by the erratic wavelength.

Another problem which may cause variations in laser power output is caused by optical feedback, which is unwanted light reflected back into a laser by optical elements external to the laser. Optical feedback can disturb laser operation and cause intensity fluctuations which may amount to as much as 10% or 20%. As more components are added, such as in an imaging lens and rotating polygon, the stable range in which the laser can operate can be decreased significantly.

Other factors may affect the stability of laser operating systems. For example, characteristics of some components change with age, and small contaminates may accumulate on the surfaces of the optical lens. This change can cause variations in reflectivity which results in optical feedback to the laser.

Past attempts to stabilize laser performance have met with mixed results. For example, thermoelectric coolers have been used to prevent ambient temperature drift. However, lasers still may change modes because laser characteristic changes or elements shift, causing optical feedback. Also thermo-electric coolers add additional cost and complexity.

Another method of stabilizing lasers is using back facet photosensors which detect a portion of the light leaving a back facet of the laser to control laser output. This has not been entirely successful because the layers of dielectric mirror coating on the back facet of the laser are wavelength specific. Therefore, small changes in the wavelength of the light leaving the back facet can result in large changes in power to the back facet sensor.

Another attempt at stabilization of lasers has used radio frequencies (RF) to stabilize lasers at low power, for example, in the range of 1 to 2 mW. These low power RF stabilization schemes, however, are not suitable for high power laser stabilization because of intensity control problems. This type of RF stabilization in a high power laser has a possibility of back-biasing the laser diode and destroying it. See U.S. Pat. Nos. 5,197,059; 5,386,409; and 5,495,464. Other undesirable features in RF control are decreased lifetime and overdriving of the laser. See U.S. Pat. Nos. 5,495,464 and 5,175,722.

It is, therefore, desirable to stabilize a laser against changes in temperature, current variations, effects of aging, and optical feedback.

SUMMARY OF THE INVENTION

It is an object of the present invention to provide a stabilized laser which is relatively insensitive to nominal changes in temperature, current, effects of aging, and optical feedback.

The present invention is directed to overcoming one or more of the problems set forth above. Briefly summarized according to one aspect of the present invention, a stabilized laser is comprised of a laser for generating radiation responsive to a control signal. A control circuit connected to the laser provides the control signal and an injection circuit injects a radio frequency signal into the control circuit and the control signal. A back facet photodiode sensor detects radiation emitted from a back facet of the laser diode and provides a feedback signal to the control circuit for adjusting laser output power.

The above, and other objects, advantages and novel features of the present invention will become more apparent from the accompanying detailed description thereof when considered in conjunction with the following drawings.

DETAILED DESCRIPTION OF THE INVENTION

The present description will be directed in particular to elements forming part of, or in cooperation more directly with, the apparatus in accordance with the present invention. It is understood that elements not specifically shown or described may take various forms well known to those skilled in the art.

Figure 2:
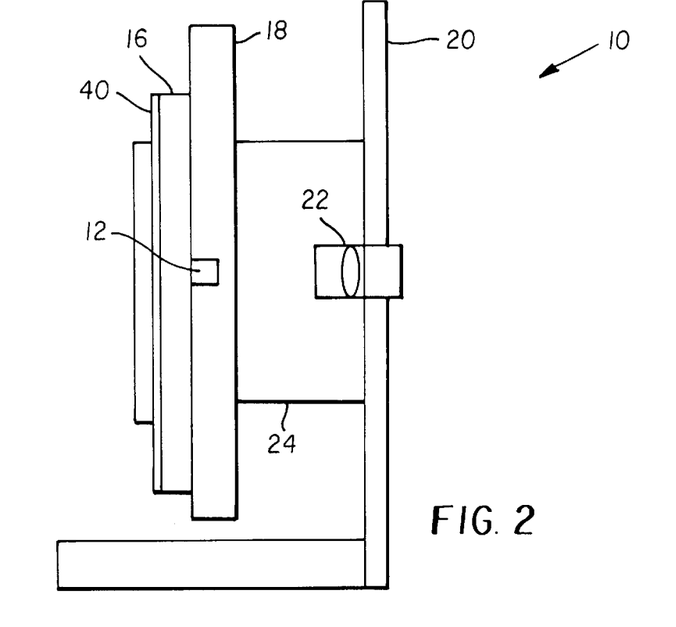
FIG. 2 is a schematic view of a radio frequency (RF) stabilized laser according to the present invention.

FIG. 2 shows an RF stabilized laser configuration 10. A laser diode 12 and laser driver assembly 40 are attached to an aluminum block 16 which is screwed to a heatsink plate 18. The heatsink plate 18 is attached to a collimator mount 24, which in turn is attached to mounting bracket 20. Collimator mount 24 also holds a collimator lens 22. The stabilized laser 10 is aligned to writer optics, not shown. In an alternate embodiment, the stabilized laser 10 is coupled to an optical fiber allowing the stabilized laser 10 to be mounted at a remote location.

Figure 3:
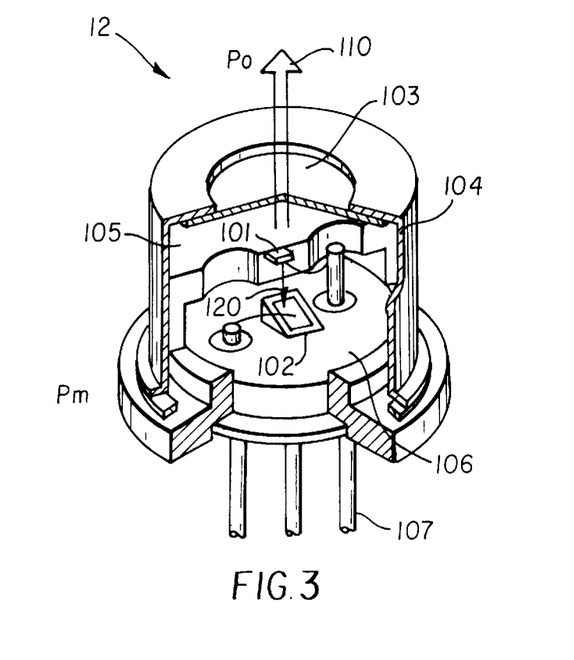
FIG. 3 is a perspective view partially cut away of a laser diode.

FIG. 3 shows a semiconductor laser 12. Laser 12 is in a container defined by a cap 104 having an aperture 103 in a stem 106 and terminal 107. A semiconductor laser element 101 is mounted on a heatsink 105 with a light-emitting face on the side of aperture 103. A back facet photodiode 102 is fixed to stem 106 with a light receiving surface facing the semiconductor laser element 101. A laser beam 110 and a light power output (Po) is emitted from the semiconductor laser element 101 through aperture 103. At the same time, a monitor beam 120 with a light power output (Pm), at usually about 3% of Po, is emitted from the semiconductor laser element 101 toward the photodiode 102. The laser beam 110 is directed through writer optics, not shown.

Figure 4:
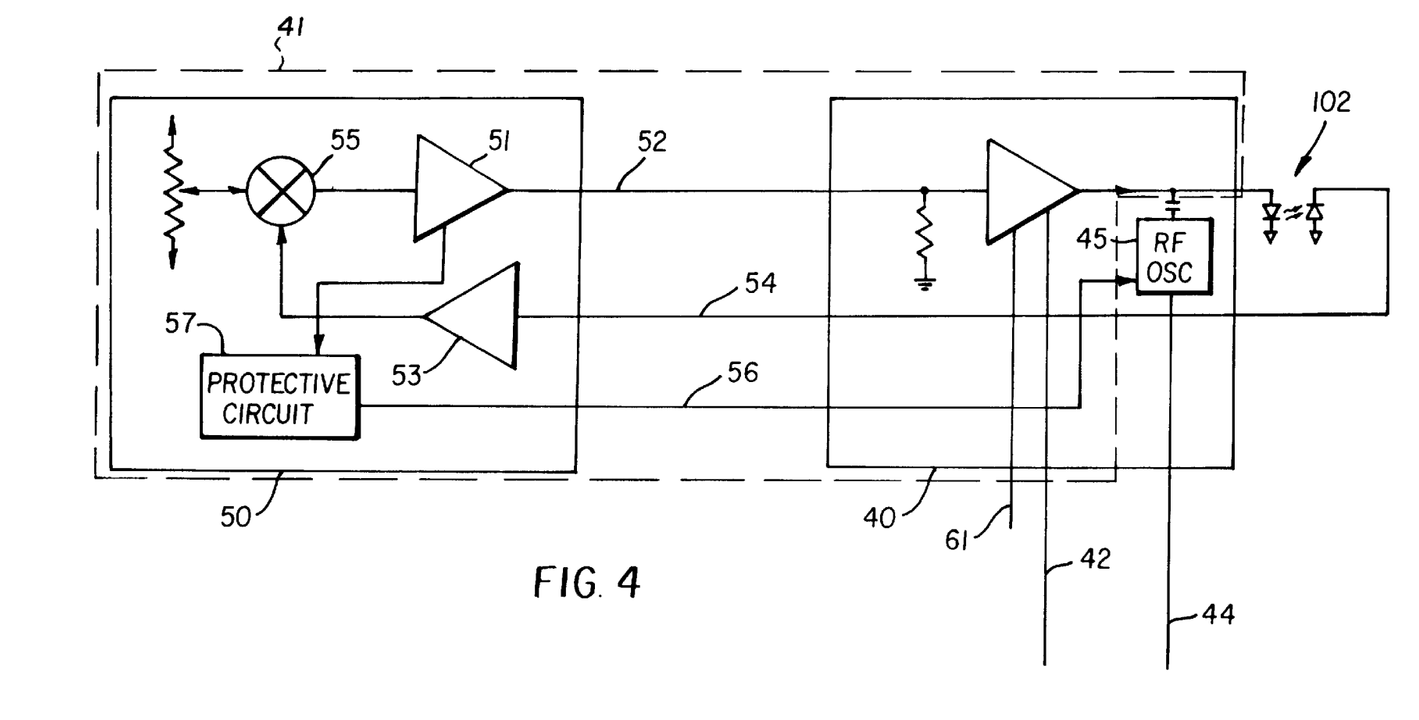
FIG. 4 shows a schematic of a control circuit and RF injection circuit.

FIG. 4 shows the laser drive system 30, comprising a control circuit 41. It consists of a laser driver assembly 40, described in more detail in U.S. Pat. No. 5,422,900. Laser assembly 40 amplifies a DC bias current and generates a RF signal. Laser driver assembly 40 requires a constant DC current input 52 and multiplies this current by a factor of approximately 18. Constant DC current input 52 is supplied by predriver 50. In addition to constant DC current input 52, DC input power 42 is the main power supply for laser driver assembly 40. RF oscillator power 44 requires a separate adjustable power supply. This adjustment allows the RF source to be matched to each laser or to be adjusted if the laser is required to run at a different power level.

Ahead of the laser driver assembly 40 is a predriver 50. It consists of a precision current driver 51, a transimpedance amplifier 53, and a summing junction 55, which form a continuous closed loop power servo based on the current from the back facet photodiode 102. A protection circuit 57 cut-out circuit senses the laser operating DC current. If the laser current is higher or lower than a predetermined value, the RF oscillator 45, an injection circuit is disabled. After the RF oscillator 45 is disabled, then the DC current can be shut down by the system computer, not shown. The maximum DC current is further limited by the impedance of the precision current driver 51, protecting the laser in the event of loss of feedback signal 54.

Figure 5:
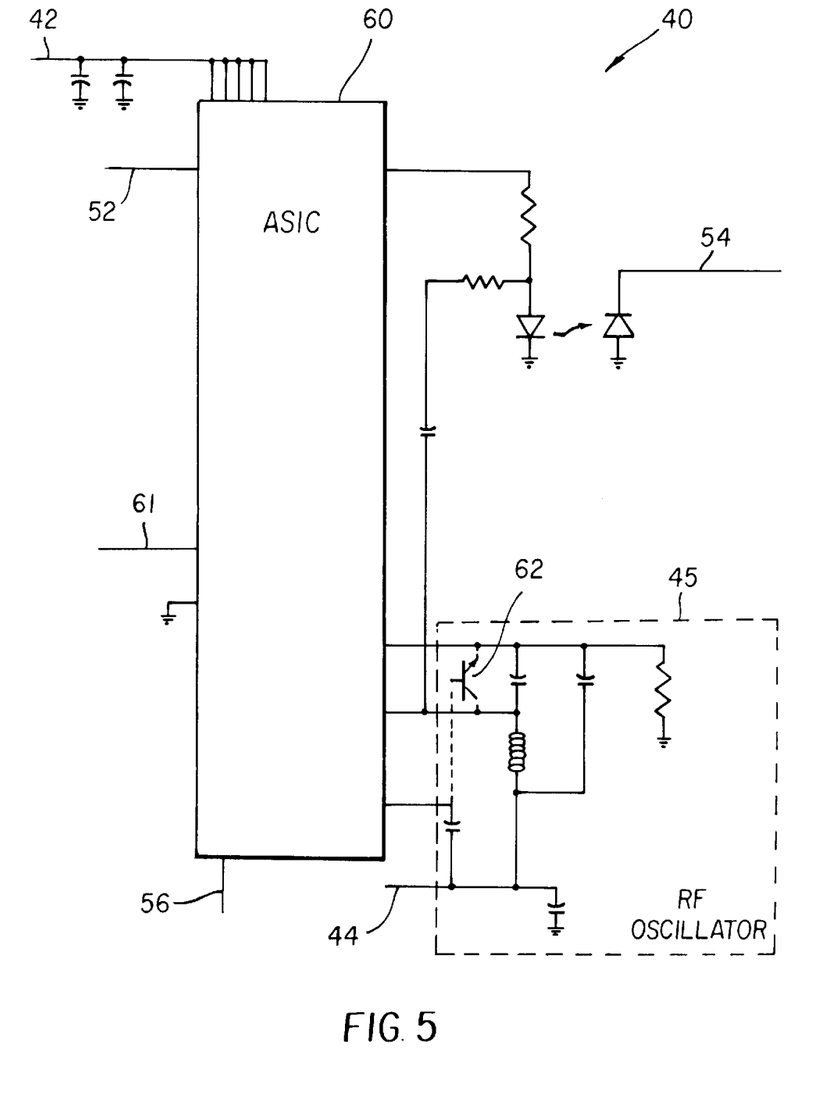
FIG. 5 shows a schematic of a laser driver application specific integrated circuit (ASIC)

FIG. 5 gives further detail of the laser driver assembly 40. A Application Specific Integrated Circuit (ASIC) 60, which performs current multiplication and handles all the control signals. The DC input current 52 is input on the readbias line for the ASIC. Laser enable 61 and oscillator enable 56 are logic controls to turn on the laser DC circuit and RF circuit. Oscillator power 44 is used to control RF amplitude. The transistor 62 shown in dashed lines has been added to increase the amount of RF power available. With transistor 62 and a 7 volt power supply, approximately 80 mA peak-to-peak can be supplied.

The RF oscillator 45 oscillates at approximately 200 MHz. Contrary to teachings in the prior art, a stabilized laser in accordance with the present invention, shows that laser writers are not sensitive to the RF frequency used. In tests on lasers incorporating the present invention, lasers were stabilized with frequencies from 50 to 600 MHz. Some optical disc references discuss an optimum frequency because of a possible strong reflector, however, in a laser writer there is not one strong source of retro-reflection at a specific distance, but many weaker sources at distances ranging from millimeters to meters. In accordance with the present invention, the RF frequency should be 10× or more than the pixel clock frequency, such that many RF cycles occur within each pixel duration.

Figure 6:
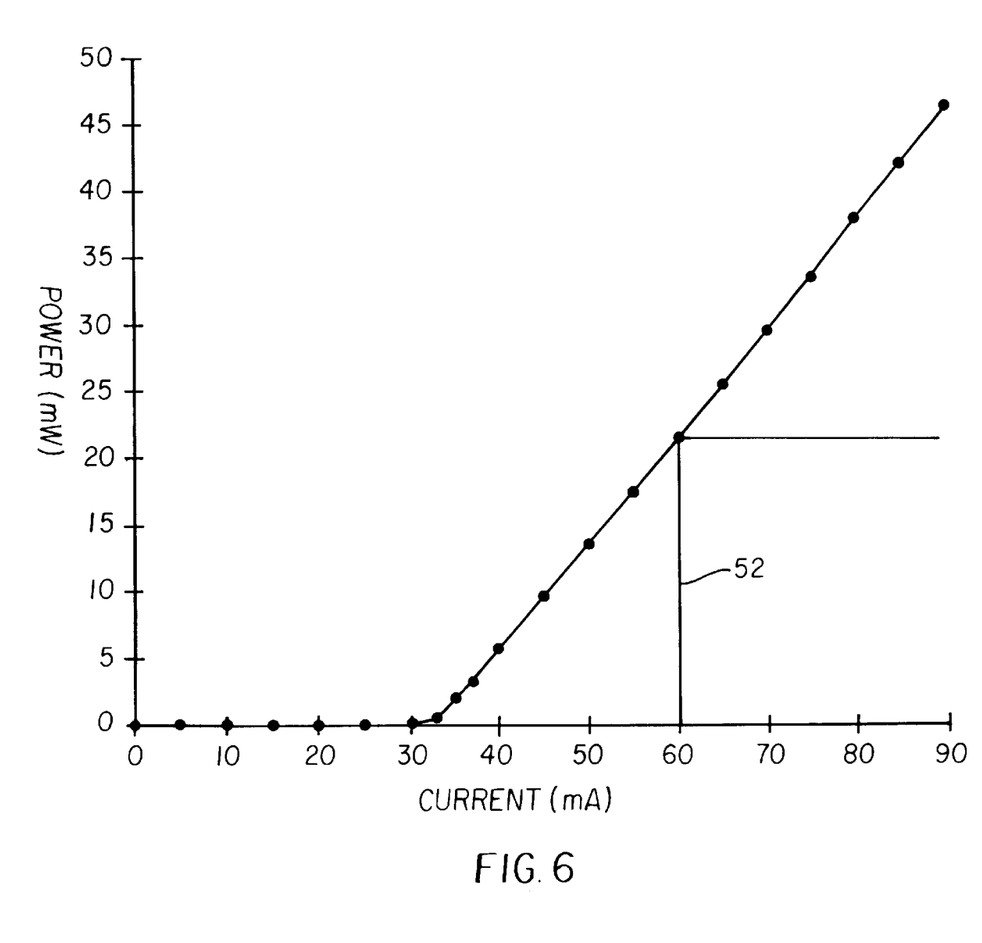
FIG. 6 shows a graph of power versus input current for an RF stabilized laser.

FIG. 6 shows the characteristic curve of a 50 mW laser, with a threshold just above 30 mA and a maximum current of 90 mA. With the DC bias set to 60 mA and the peak-to-peak RF current set at 60 mA, then the laser power will swing from just below threshold near to the rated power of 50 mW. The average power out of the laser is stable at about 25 mW.

Figure 7A:
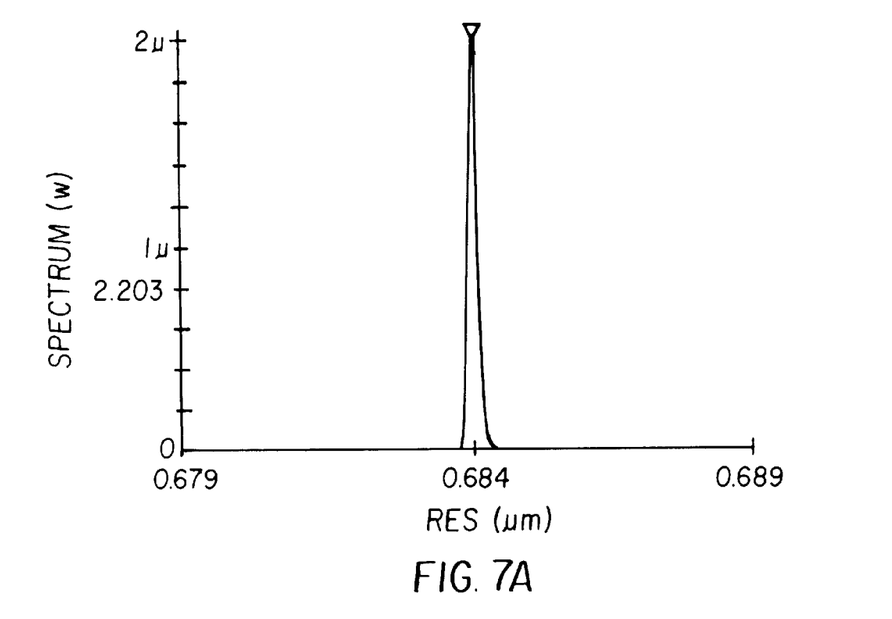
FIGS. 7a–7c show the optical spectrum of a laser with only direct current (DC) bias supplied, mode hopping, and with an RF signal according to the present invention applied.
Figure 7B:
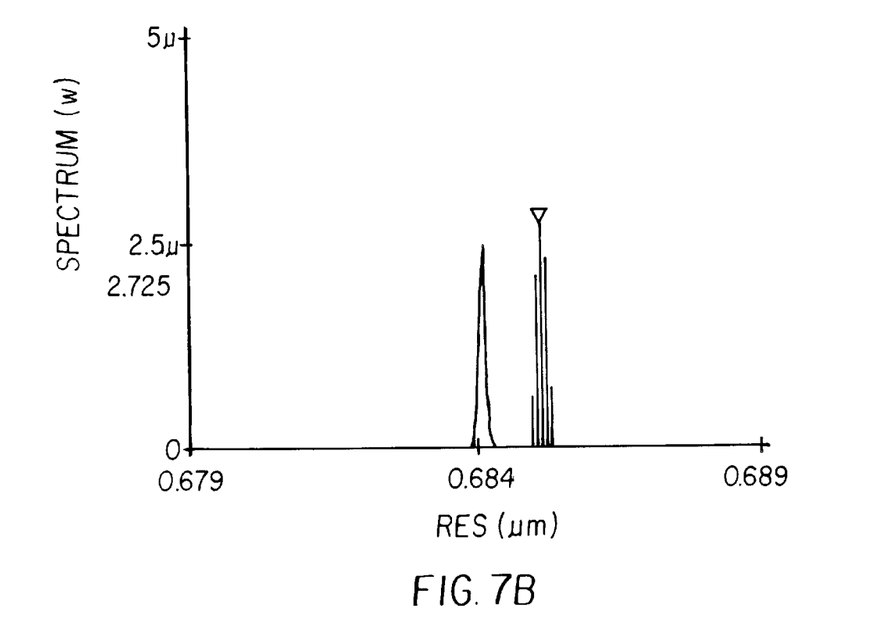
Figure 7C:
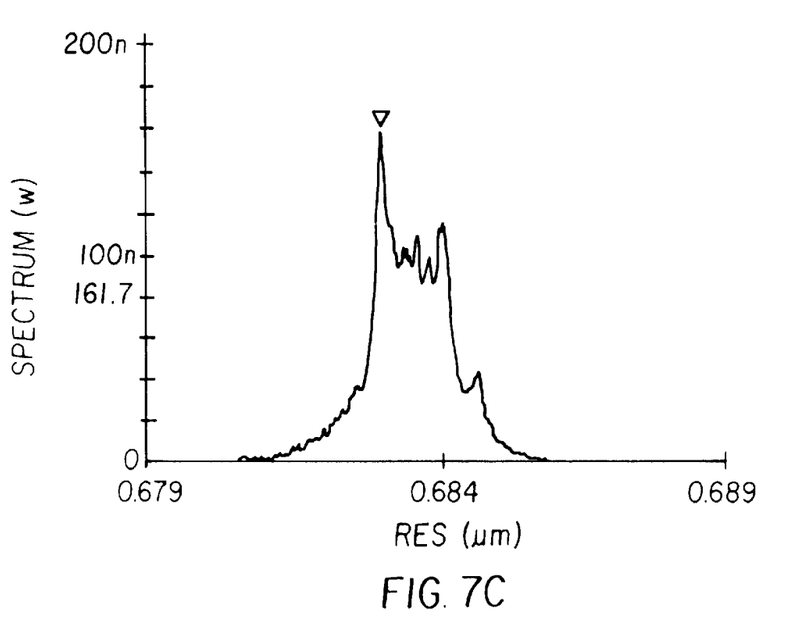

FIG. 7a shows the optical spectrum of a laser running single mode at 684 nm with only the DC bias applied. FIG. 7b shows the same laser under similar conditions but mode hopping from 684 to 685 nm. FIG. 7c shows the laser with the RF level described above running with a stable spectrum of multiple longitudinal modes. At a given ambient temperature, this spectrum will not change, and the power out of the laser as controlled by the back facet photodiode will be constant.

Figure 8:
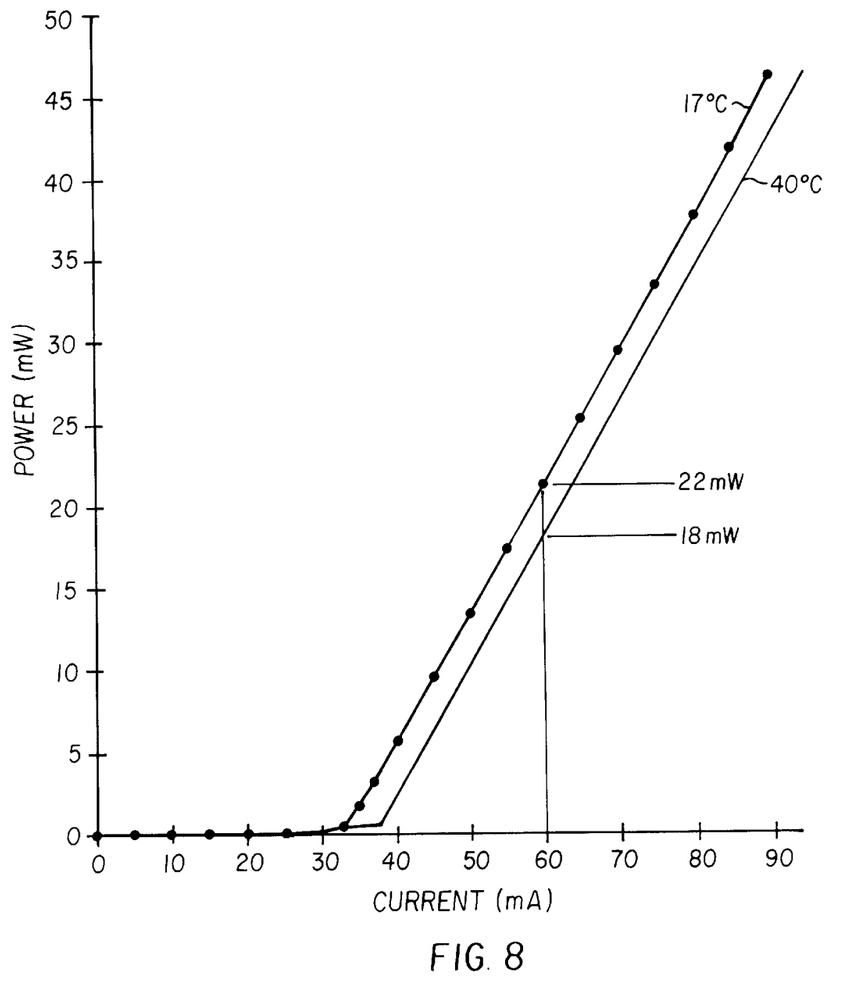
FIG. 8 is a graph of change in laser power caused by changes in temperature.

FIG. 8 shows the result of increasing the ambient temperature from 17° to 40° C. The characteristic curve of the laser shifts to the right such that the DC bias that once produced about 25 mW will now only produce about 20 mW. The back facet photodiode will sense the loss of light level and will automatically increase the laser current to restore the power.

Figure 9:
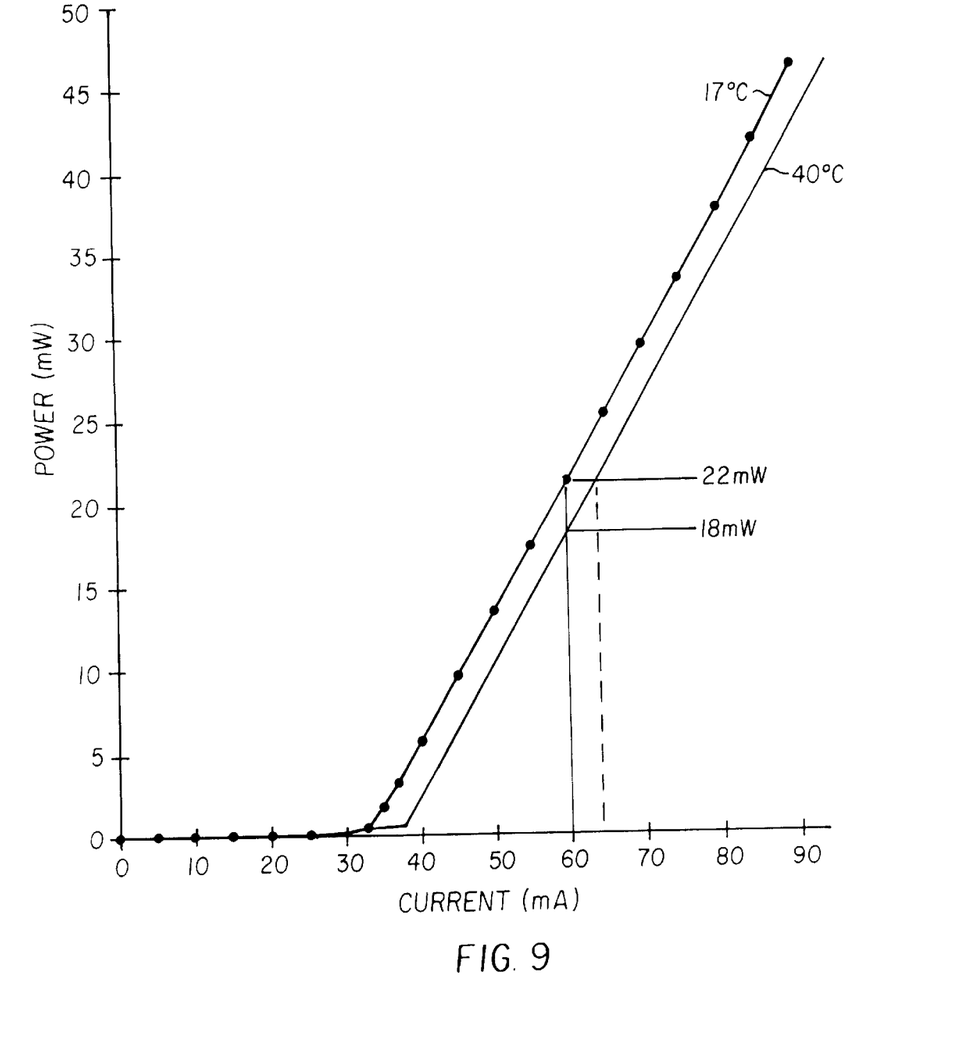
FIG. 9 shows shift in DC bias to compensate for a change in temperature.

FIG. 9 shows how the DC bias shifts to give the correct power level and that the RF level still ranges from threshold to maximum. The laser spectrum and power level are still stable at the higher temperature. The laser spectrum will shift slowly to longer wavelengths as the temperature is increased. The back facet photodiode will keep a constant photocurrent maintained by its feedback loop. Because of the spectral shift and the wavelength sensitivity of the back facet mirror, the laser power will be slightly different at the elevated temperature. The shift is basically linear at 0.2%/° C. Appropriate system calibration intervals will prevent this drift from affecting image quality.

Thus, it is seen that a stabilized laser according to the present invention using radio frequency signal injection and back facet feedback control is relatively insensitive to changes in temperature, current, effect of aging, and optical feedback.

The invention has been described in detail with particular reference to certain preferred embodiments thereof, but it will be understood that variations and modifications can be effected within the spirit and scope of the invention.

| PARTS LIST | |
|---|---|
| 10 | RF stabilized laser |
| 12 | laser diode |
| 16 | aluminum block |
| 18 | heatsink |
| 20 | mounting bracket |

-continued

PARTS LIST

| | |
|---|---|
| 22 | collimator lens |
| 24 | collimator mount |
| 30 | laser drive system |
| 40 | laser driver assembly 41 control circuit |
| 42 | DC input power |
| 44 | RF oscillator power |
| 45 | RF oscillator (radio frequency injection circuit) |
| 50 | predriver |
| 51 | precision current driver |
| 52 | DC current input |
| 53 | transimpedance amplifier |
| 55 | summing junction |
| 56 | oscillator enable |
| 57 | protection circuit |
| 60 | ASIC |
| 61 | laser enable |
| 62 | transistor |
| 101 | semiconductor laser element |
| 102 | back facet photodiode |
| 103 | aperture |
| 104 | cap |
| 105 | heatsink |
| 106 | stem |
| 107 | terminal |
| 110 | laser beam |

What is claimed is:

1. A stabilized laser comprising:

a laser responsive to a control signal for generating a radiation beam;

a control circuit connected to said laser for providing said control signal to said laser;

an injection circuit connected to said control circuit for injecting a radio frequency signal into said control signal;

a back facet photodiode sensor for detecting radiation from a back facet of said laser and for providing a feedback signal to said control circuit for maintaing a power level of said laser constant; and wherein said radio frequency signal has an amplitude such that said amplitude, subtracted from said control signal, decreases said control signal to at least a laser threshold level.

2. A stabilized laser as in claim 1 wherein a cut-out circuit shuts off said RF signal whenever said control signal exceeds a preset minimum or maximum.

3. A stabilized laser as in claim 2 wherein said cut-out circuit shuts off said control signal after said RF signal is shut off.

* * * * *